United States Patent [19]

Nailor, III et al.

[11] 3,969,010
[45] July 13, 1976

[54] SUBSTRATE WITH IMPROVED CONTACT TERMINALS

[75] Inventors: William Kirby Nailor, III, Camp Hill; David Clyde Thompson, Mechanicsburg, both of Pa.

[73] Assignee: E. I. Du Pont de Nemours and Company, Wilmington, Del.

[22] Filed: May 17, 1974

[21] Appl. No.: 471,023

[52] U.S. Cl. ................. 339/17 C; 339/176 MP
[51] Int. Cl.² ........................................ H05K 1/06
[58] Field of Search ............ 339/17 R, 17 C, 17 LC, 339/176 MP, 126 R, 276 R, 276 SF

[56] References Cited
UNITED STATES PATENTS

| | | | |
|---|---|---|---|
| 2,958,926 | 11/1960 | Morison | 339/17 CX |
| 2,993,188 | 7/1961 | Anderson | 339/17 LC |
| 3,138,675 | 6/1969 | Krone | 339/17 LC X |
| 3,217,208 | 11/1965 | Castro | 339/17 C X |
| 3,597,722 | 8/1971 | Walter | 339/17 C X |
| 3,706,065 | 12/1972 | Knitter | 339/176 MP X |

FOREIGN PATENTS OR APPLICATIONS 233,970 2/1960 Australia ................ 339/17 LC Primary Examiner—Roy Lake
Assistant Examiner—E. F. Desmond

[57] ABSTRACT

An improved substrate for mounting electronic components including a plurality of uniformly spaced terminals on opposite sides along an edge of the substrate. The terminals comprise a contact having an outward bow, a narrowed transition section extending from the contact at an oblique angle from the longitudinal axis of the contact, and a tail bent at an angle, inserted through a first hole spaced from the edge of the substrate, bent at a second opposite angle along a side of the substrate, and inserted laterally in a second spaced hole by forming a U-shaped bend in the tail within the hole.

11 Claims, 7 Drawing Figures

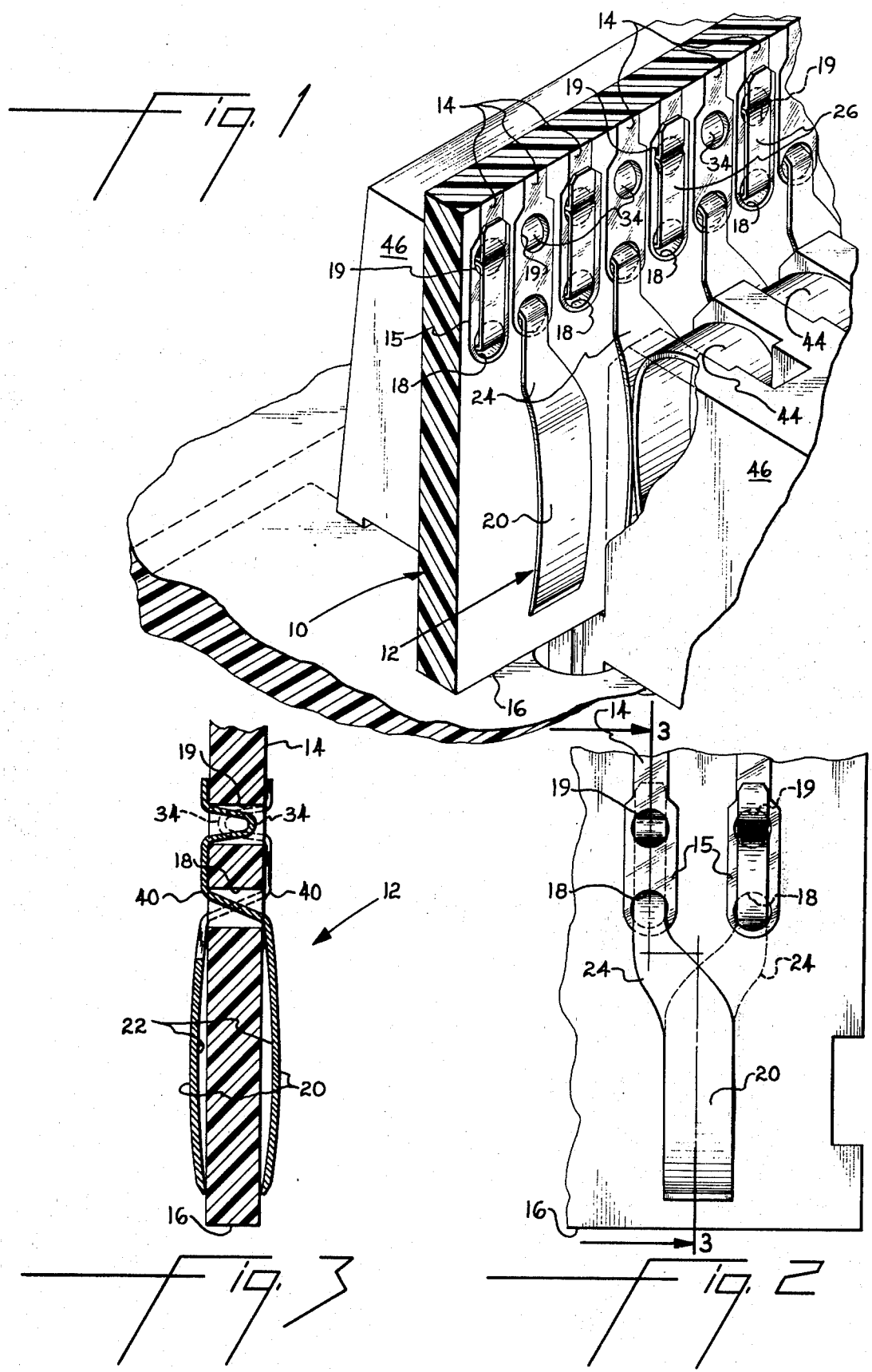

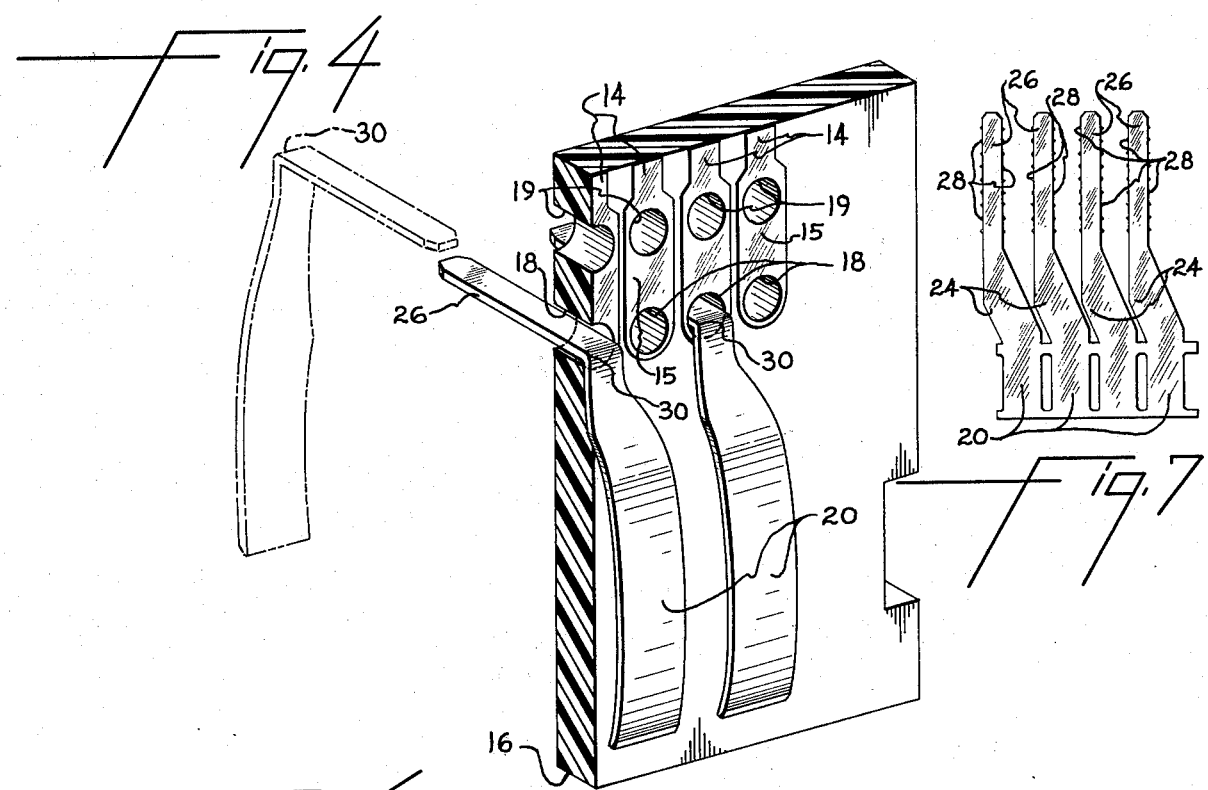
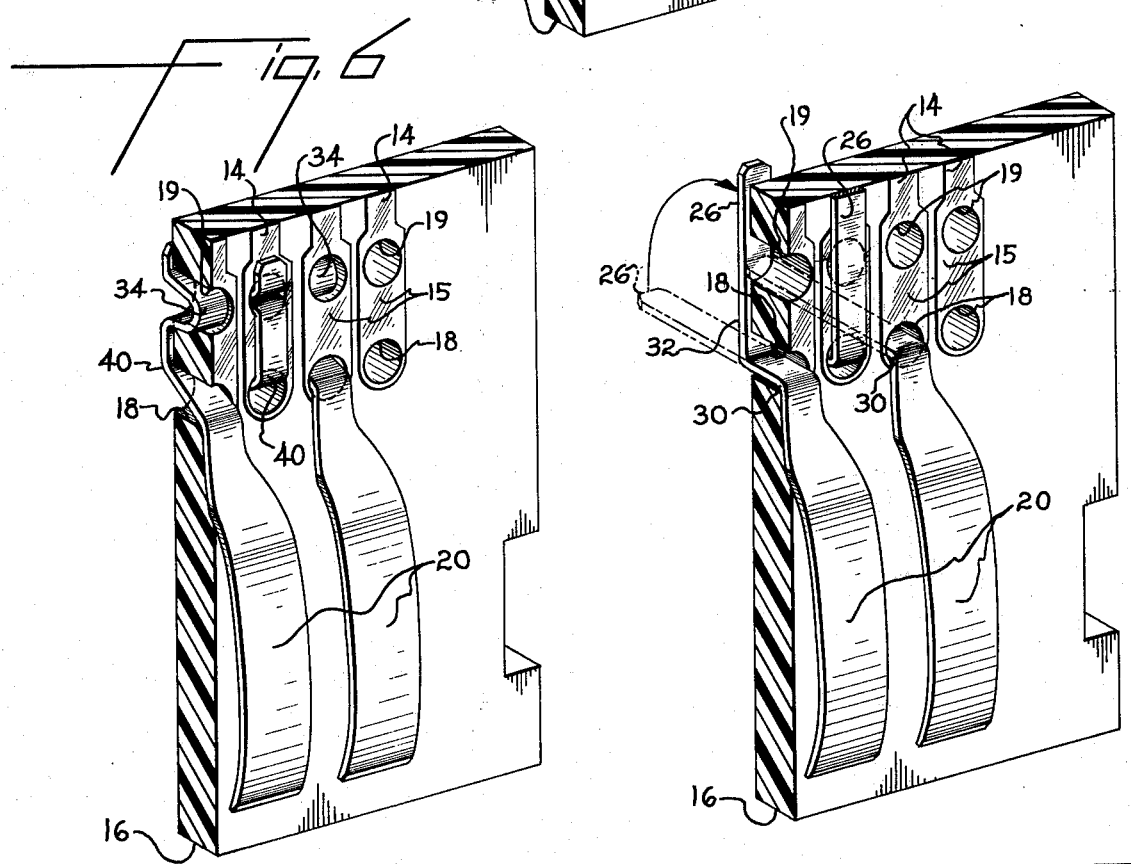

3,969,010

SUBSTRATE WITH IMPROVED CONTACT TERMINALS

BACKGROUND OF THE INVENTION

1. Field of the Invention

The invention relates to a substrate for mounting electronic components having a plurality of electrical contacts along an edge of the substrate, and particularly relates to a substrate having a plurality of pairs of spaced holes surrounded by conductive paths along an edge of the substrate. More particularly, the invention relates to a substrate for mounting electronic components on one side of the substrate, having uniformly spaced terminals along an edge on opposite sides of the substrate.

2. Description of the Prior Art

Substrates for mounting electronic components, e.g. printed circuit boards, are well known in the prior art. Such substrates or circuit boards have conductive paths thereon interconnecting a plurality of electronic components. Some of the conductive paths terminate along an edge of the substrate to provide terminals which are plated or cladded with a corrosion resistant metal or metal alloy for removably inserting the terminals in a receptacle. U.S. Pat. No. 3,396,461 describes a method of cladding the conductive paths along an edge of a printed circuit board. Alternatively, a separate terminal may be formed from strip metal and bent about an edge of a circuit board, as described in U.S. Pat. No. 2,993,188, wherein a strip is bent in a U-form having a tongue for insertion through a hole in the circuit board and engagement with the strip on the other side of the board. A similar contact is described in U.S. Pat. No. 3,706,065, wherein the contact is formed of strip metal and bent about an edge of a circuit board, through a first opening and into a hole provided in the board surrounded by a conductive path on the board. A circuit board having a pair of spaced holes, inward of an edge of the circuit board, and a terminal for connecting wires to the conductive paths on the board is described in U.S. Pat. No. 3,336,561. A contact device having circuit wires looped into and anchored within holes formed in a substrate is described in U.S. Pat. No. 3,069,599. An electrical component mounting wherein a component wire lead with a U-shaped offset is inserted in an elongated opening is described in U.S. Pat. No. 3,693,052. A circuit board having first and second circuit patterns on opposite sides and terminals along an edge of the circuit board on opposite sides is described in U.S. Pat. No. 3,020,510.

The improved substrate of the present invention having a plurality of uniformly spaced terminals on opposite sides of the substrate along an edge of the substrate can be readily distinguished from the prior art terminals. The uniformly spaced terminals on opposite sides of the substrate provide twice the contact density of terminals folded over the edge of the substrate. Further, the terminals are distinguished by their geometrical configuration wherein a narrow tail provides for higher density connections to closely spaced conductive paths on one side of the substrate, while the wide contacts on opposite sides along an edge of the substrate provide a sufficient contact area for reliable pluggable insertion in a conventional receptacle. The geometrical configuration permits mounting contacts on the same centers on opposite sides of the substrate.

SUMMARY OF THE INVENTION

According to the present invention there is provided a substrate for mounting electronic components having a plurality of conductive paths on at least one side thereof, the conductive paths terminating along an edge of the substrate, and the substrate having a plurality of pairs of spaced holes inward of the edge surrounded by the conductive paths, the improvement comprising a plurality of uniformly spaced contact terminals on opposite sides of the substrate along an edge of the substrate; each terminal comprising a contact outwardly bowed from a side of the substrate, a transition section extending from the contact at an oblique angle with a longitudinal axis of the contact, and a narrowed tail connected to the contact by the transition section, the tail having a longitudinal axis substantially parallel with and laterally offset from the longitudinal axis of the contact; the tail having a first bend, a segment inserted through the first hole inward from the edge of the substrate, a second opposite bend, a segment along the opposite surface of the substrate, and a U-shaped bend within the second hole, wherein the second bend forms a fulcrum about the edge of the first hole on the opposite side of the substrate from the contact and holds the contact on the substrate for subsequent soldering.

Preferably, the tail is equal to or less than one-half the width of the contact, and the contacts are uniformly spaced opposite each other on both sides of the substrate.

The improved circuit board of the present invention provides a substantial improvement over the prior art terminals in that it reliably secures the terminals for subsequent soldering and obviates the necessity of bending the terminal about the edge of the substrate, thus providing for higher density conductive paths terminating along an edge of the substrate by providing removably insertable uniformly spaced terminals on opposite sides of the substrate. Additionally, the terminals are useful with substrates of different thickness by forming the U-shaped bend to correspond with the thickness of the substrate.

BRIEF DESCRIPTION OF THE DRAWINGS

FIG. 1 is a perspective view of a substrate and terminals according to the present invention including a conventional receptacle.

FIG. 2 is a front view of the substrate and terminals of FIG. 1.

FIG. 3 is a side view in section of the substrate and terminals along line 3—3 of FIG. 2.

FIGS. 4, 5 and 6 are perspective views illustrating the application of the terminals to the substrate.

FIG. 7 is a front view of a strip of contact terminals according to the invention.

DETAILED DESCRIPTION OF A PREFERRED EMBODIMENT OF THE INVENTION

A preferred embodiment of the invention is described below with reference to the attached drawing, wherein the same numerals are used throughout to identify the same elements.

A preferred embodiment of the invention comprises a substrate 10, e.g. a printed circuit board, having a plurality of uniformly spaced terminals 12 disposed opposite one another on both sides of the substrate. The substrate 10 is made of an insulative material and has a plurality of closely spaced conductive paths 14 on at least one side for interconnecting a plurality of electronic components (not illustrated) mounted thereon. The conductive paths 14 terminate near the edge 16 of the substrate. Preferably, conductive pads 15, which may be slightly wider than the paths 14, are provied and surround a pair of spaced holes 18 and 19 inward of the edge of the substrate 10. The holes 18 and 19 may be plated through, but plated-through holes are not necessary to the invention.

The terminals 10 comprise a contact 20 having an outward longitudinal bow 22, a narrowed transition section 24 extending from the contact 20 at an oblique angle with the longitudinal axis of the contact 20, and a tail 26 connected to the contact 20 by transition section 24. The tail 26 preferably has a longitudinal axis substantially parallel with and laterally offset from the longitudinal axis of the contact 20. A plurality of barbs 28 may be provided along opposite edges of the tail 26.

The terminals 10 are applied to the substrate by first making a right angle bend 30 in the tail 26 and inserting it through the first hole 18 inward from edge 16 of substrate 10, placing the contact 20 along one side of the substrate 10, as illustrated in FIG. 4. A second opposite right angle bend 32 is then made in the tail to place the lead along the opposite side of the substrate 10 and over hole 19, as illustrated in FIG. 5. The tail 26 is then laterally inserted in the second spaced hole 19. The lateral insertion e.g. by staking, forms a U-shaped bend 34 in tail 26 within the second spaced hole 19. The lateral insertion also wipes the tail 26 along the pad 15 on the surface of substrate 10 between the spaced holes 18 and 19 and slightly opens the right angle bends 30 and 32. This establishes a fulcrum 40 about the first hole 18 and the opposite surface of the substrate 10. The U-shaped bend holds the tail in hole 19 and fulcrum 40 holds the contact against the opposite side of the substrate to secure the terminal 10 for subsequent soldering to the pads 15, e.g. by wave or dip soldering. Generally, the width of the tail 26 is less than the diameter of spaced holes and the retention of the tail is by the legs of the U-shaped bend 34 engaging the walls of hole 19. Barbs 28, may be provided on the opposite edges of the tail 26 to aid in retaining the U-shaped bend 34 in hole 19 by engaging the interior sides of the hole 19.

The longitudinal outward bow 22 in each contact 20 provides a resilient contact surface for engaging each of the conventional resilient mating contacts 44 mounted in opposing members 46, and in combination with contacts 44 provides a highly reliable removably insertable or pluggable electrical interconnection between the terminals on the substrate 10 and other electronic circuits mounted on similar substrates or terminals.

The contact terminals of the present invention may be stamped formed from continuous strip metal spring stock, e.g. brass, steel, phosphor-bronze, etc., and a plurality of terminals may be conventionally connected in strip form by one or more narrow strips of the metal stock between adjacently stamped terminals as illustrated in FIG. 7, or projecting from a carrier strip. The terminals may be automatically applied to a substrate by suitable apparatus for bending and inserting the tail in the spaced holes, as described above.

While the above description and attached drawings illustrate a preferred embodiment of the substrate and contact terminals of the present invention, it being apparent that other embodiments, modifications and equivalents will be obvious to one skilled in the art, the invention is not to be limited except by the appended claims.

We claim:

1. In a substrate for mounting a plurality of electronic components; the substrate having a plurality of conductive paths on at least one surface terminating adjacent an edge of the substrate and a pair of spaced holes inward from the edge surrounded by the conductive paths, the improvement comprising a plurality of individual uniformly spaced contact terminals on opposite sides along an edge of the substrate, each terminal comprising a contact outwardly bowed from a side of the substrate and a narrowed tail connected to the contact, said tail having a first bend, a segment inserted through the first spaced hole inward from the edge of the substrate, a second opposite bend, a segment along the opposite side of the substrate, and a U-shaped bend within the second spaced hole.

2. A substrate, as recited in claim 1, wherein said tail is connected to said contact through a transition section extending from said contact at an oblique angle with the longitudinal axis of said contact.

3. A substrate, as recited in claim 2, wherein said tail has a longitudinal axis which is substantially parallel with and laterally offset from the longitudinal axis of the contact.

4. A substrate, as recited in claim 2, wherein said tail additionally comprises a plurality of barbs projecting from opposite edges of said tail for engaging the interior sides of the second spaced hole when the tail is laterally inserted therein.

5. A substrate, as recited in claim 1, wherein the width of said tail is equal to or less than one half the width of said contact.

6. In a printed circuit board for mounting a plurality of electronic components having a plurality of conductive paths on one side of the board, and a pair of spaced holes inward from the edge of the board surrounded by the conductive paths adjacent an edge of the board, the improvement comprising a plurality of uniformly spaced contact terminals on opposite sides of the board along an edge of the board connected to the conductive paths on one side of the board, each terminal comprising a contact outwardly bowed from the side along an edge of the board, a transition section extending from said contact at an oblique angle with the longitudinal axis of the contact, and a narrowed tail connected to said contact through said transition section, said tail having a first bend, a segment inserted through the first spaced hole inward from the edge of the board, a second opposite bend, a segment along the opposite side of the board, and a U-shaped bend within the second spaced hole.

7. A circuit board, as recited in claim 6, wherein said tail additionally comprises a plurality of barbs projecting from opposite sides of said tail.

8. A circuit board, as recited in claim 6, wherein the width of said tail is less than or equal to one half the width of said contact.

9. A contact terminal for mounting on a substrate along an edge thereof comprising, a contact having an outward bow, a transition section extending from said contact at an angle to the longitudinal axis of said contact, and a narrowed tail connected to said contact through said transition section, said tail having a longitudinal axis substantially parallel with and offset from the longitudinal axis of said contact.

10. A contact terminal, as recited in claim 9, wherein said tail has a plurality of barbs projecting from opposite edges thereof.

11. A contact as recited in claim 9, wherein the width of said tail is equal to or less than one half the width of said contact.

* * * * *